United States Patent
Lin

(10) Patent No.: US 11,355,476 B2
(45) Date of Patent: Jun. 7, 2022

(54) MULTI-CHIP PACKAGE STRUCTURE HAVING DUMMY PAD DISPOSED BETWEEN INPUT/OUTPUT UNITS

(71) Applicant: eGalax_eMPIA Technology Inc., Taipei (TW)

(72) Inventor: Po-Chuan Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 72 days.

(21) Appl. No.: 17/034,184

(22) Filed: Sep. 28, 2020

(65) Prior Publication Data

US 2022/0028832 A1 Jan. 27, 2022

(30) Foreign Application Priority Data

Jul. 24, 2020 (TW) .................. 109125165

(51) Int. Cl.
*H01L 23/00* (2006.01)
*H01L 25/065* (2006.01)
*H01L 23/498* (2006.01)

(52) U.S. Cl.
CPC .... *H01L 25/0657* (2013.01); *H01L 23/49811* (2013.01); *H01L 24/06* (2013.01); *H01L 24/46* (2013.01); *H01L 2224/0651* (2013.01); *H01L 2224/06102* (2013.01)

(58) Field of Classification Search
CPC ... H01L 23/49811; H01L 24/06; H01L 24/46; H01L 25/0657; H01L 2224/06102; H01L 2224/0651
USPC .................................................. 257/686, 700
See application file for complete search history.

(56) References Cited

U.S. PATENT DOCUMENTS

2020/0258841 A1* 8/2020 Kim ...................... H01L 23/367

* cited by examiner

*Primary Examiner* — Hoai V Pham
(74) *Attorney, Agent, or Firm* — Muncy, Geissler, Olds & Lowe, P.C.

(57) ABSTRACT

A multi-chip package structure includes outer leads, a first chip and a second chip. The outer leads are disposed on a side of a chip bonding area of a package carrier thereof. The first chip is fixed on the chip bonding area and includes a core and a seal ring. Input/output units, and first bonding pads are disposed, in an outward order, on at a side of the core. Each first bonding pad is electrically connected to a corresponding outer lead through a first wire. Dummy pads are disposed between the input/output units and adjacent first bonding pads on the side of the core. The second chip is stacked on the core and includes second bonding pads connected to the corresponding outer leads through second wires and dummy pads, so as to prevent from short circuit caused by soldering overlap and contact between the wires.

9 Claims, 6 Drawing Sheets

MULTI-CHIP PACKAGE STRUCTURE HAVING DUMMY PAD DISPOSED BETWEEN INPUT/OUTPUT UNITS

This application claims the priority benefit of Taiwan patent application number 109125165, filed on Jul. 24, 2020.

BACKGROUND OF THE INVENTION

1. Field of the Invention

The present invention provides a multi-chip package structure, more particularly to a chip design applied to an in-vehicle computer; in the multi-chip package structure, at least one row of dummy pads are disposed on a first chip on the package carrier, at least one group of second solder pads of a second chip can be electrically connected to outer leads through second wires and the dummy pads, to prevent form short circuit caused by overlap and contact between the wires, so that the quad-flat no-leads (QFN) package can be performed to form the chip.

2. Description of the Related Art

In recent years, most automotive chips used in general in-vehicle computers are QFN-packaged chips; in the QFN package structure, two chips are stacked with each other, as shown in FIGS. 3, 4, 5, and 6, the bonding wire A1 on the upper chip A must be paid special attention in angle, and the bonding wires A1 for different signals cannot be intersected; the bonding wire A1 located on the upper chip A1 and the bonding wire B1 located on the lower chip B1 must form a height difference and cannot be overlaid to contact with each other, otherwise short circuit occurs. However, due to factors including packaging pressure and mold flow during the packaging process, the adjacent bonding wires A1 and B1 are easy to sink, bend or shift to overlap and contact with each other, and it causes short circuit problem, as shown in the upper left and lower right corners of FIGS. 5 and 6. The above-mentioned problem results in chip package failure and malfunction of the automotive chip, and increase in product defect rate. In order to maintain the height difference between the bonding wire A1 of the chip A and the bonding wire B1 of the chip B, the automotive chip has a higher height after packaging.

Furthermore, since the upper chip A and the lower chip B in automotive chip are usually manufactured by different manufacturers, the designs and configurations of the circuits and first bonding pad pins of the chips A and B manufactured by different manufacturers are different, and adjacent distances W1 and W2 are also different, the circuit layout and pin configuration of the bonding pads B2 of the lower chip B must be adjusted to match with the bonding pads A2 of the upper chip A; however, when the upper chip A is to be replaced by the chip of different manufacturer, the circuit layout, pin configuration and soldering pads of the lower chip B must be redesigned and adjusted, and the new packaged automotive chip must be tested again, and the above-mentioned process is very time-consuming and labor-intensive and extremely not economical. Therefore, how to solve the problem that the bonding wires of the existing automotive chip is easy to overlap and contact to cause short circuit and package failure, and the problem that the circuit layout and bonding wire configuration of the lower chip must be redesigned and adjusted when the upper chip is replaced by different chip, is a key issue in the industry.

SUMMARY OF THE INVENTION

Therefore, inventors develop a multi-chip package structure applicable to an in-vehicle chip according to collected data, multiple tests and modifications, and years of experience in the industry, to solve the conventional problems.

An objective of the present invention is to provide a chip design for a multiple-chip stacked package and more particularly to an automotive chip design applied to an in-vehicle computer; the automotive chip includes a plurality of outer leads, a first chip and a second chip; the plurality of outer leads are disposed on at least one side of a chip bonding area on a central part of a top surface of a package carrier thereof and configured to electrically connect to an external preset electronic circuit. The first chip can be electrically fixed on the chip bonding area and includes a core and a seal ring disposed thereon, and a plurality of input/output units and a plurality of first bonding pads disposed thereon, in an outward order from at least one side of the core and electrically connected to the core; the plurality of first bonding pads are configured to electrically connect to the corresponding ones of the outer leads through first wires, respectively; the first chip also includes a plurality of dummy pads disposed thereon and between the plurality of input/output units and adjacent first bonding pads on at least one side of the core. The second chip is stacked and fixed on the core of the first chip, and includes at least one group of second bonding pads disposed on the surface thereof and electrically connected to the corresponding ones of the outer leads through second wires and the dummy pads. The wires can be disposed in the same heights and in an adjacent and separate arrangement, to prevent from height difference and intersect or approach between the inner wires and outer wires, so that the QFN package can be performed on the package carrier and the chips without occurrence of short circuit due to overlap and contact between the wires, thereby achieving purpose of easy to manufacture and improved product yield.

Another objective of the present invention is that the first chip is produced by using repeatable masks in processes to form patterns of different layers of the chip on the package carrier having conductive vias, so as to build layers including a transistor layer, a metal layer and a VIA layer by process, and the layers can be transformed into micro transistors and circuits of the chip, and a preset routing line in an X axis or a Y axis can be disposed between the adjacent metal layers, and the preset routing lines of the layers can be electrically connected through the conductive vias formed inside the through holes vertically penetrated through the VIA layer; the first bonding pads and dummy pads, which are disposed on two opposite sides of the input/output units on at least one sides of the surfaces of the uppermost two layers of the chip, can be disposed in an alignment or misalignment manner; in another embodiment, the first bonding pads and the dummy pads, which are adjacent to each other disposed on a side of the input/output units on at least one side of the surface of the uppermost two layers of the first chip, can be arranged in an alignment or misalignment manner.

Another objective of the present invention is that the QFN package can be formed on the package carrier and the at least two chips (such as the first chip and the second chip) to produce the automotive chip, so that the height (thickness) of the automotive chip can be effectively reduced, thereby achieving the purpose of meeting the requirements of light, thin, short and small electronic components.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
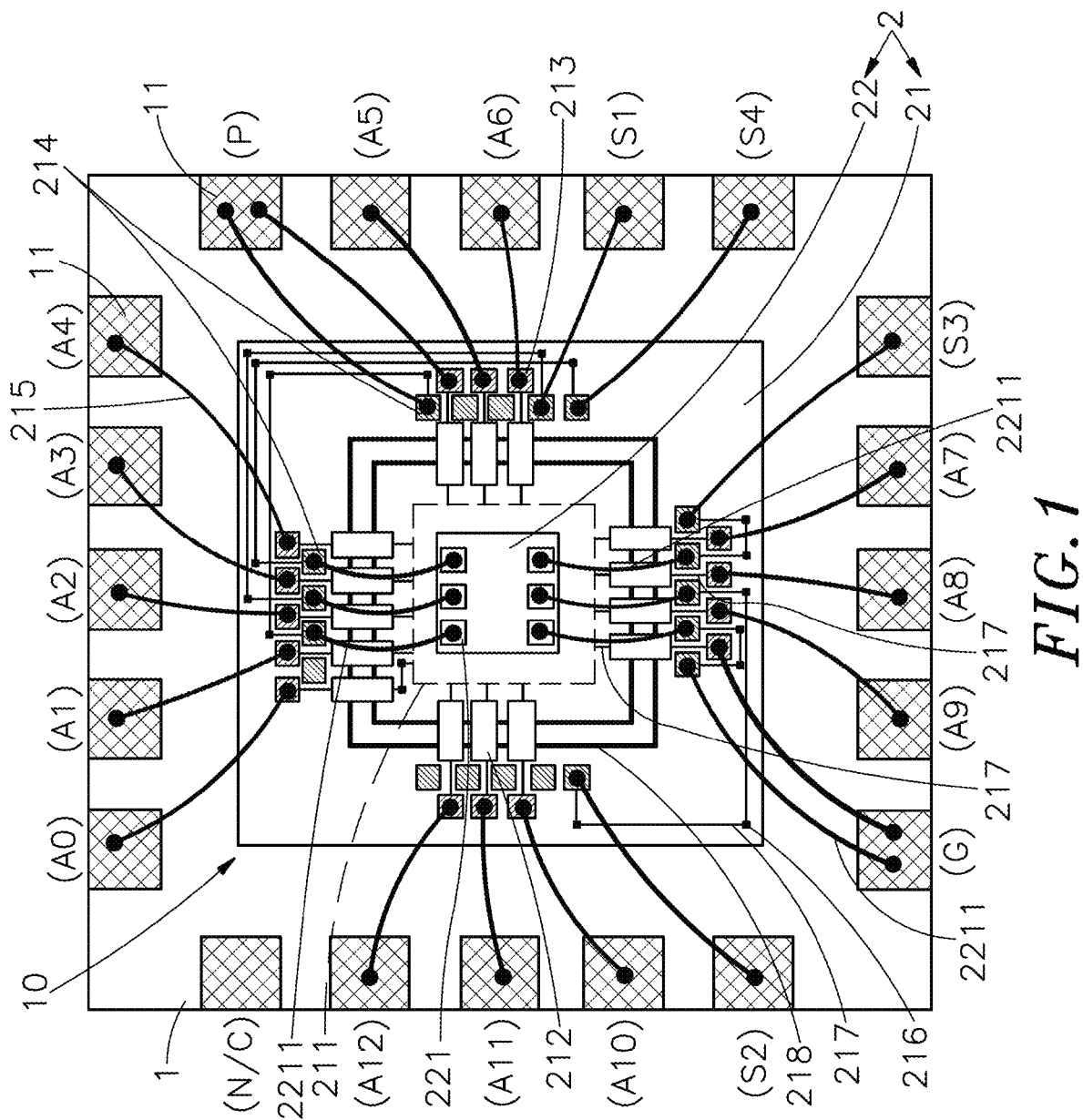
FIG. 1 is a top view of a chip of a preferred embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 2:
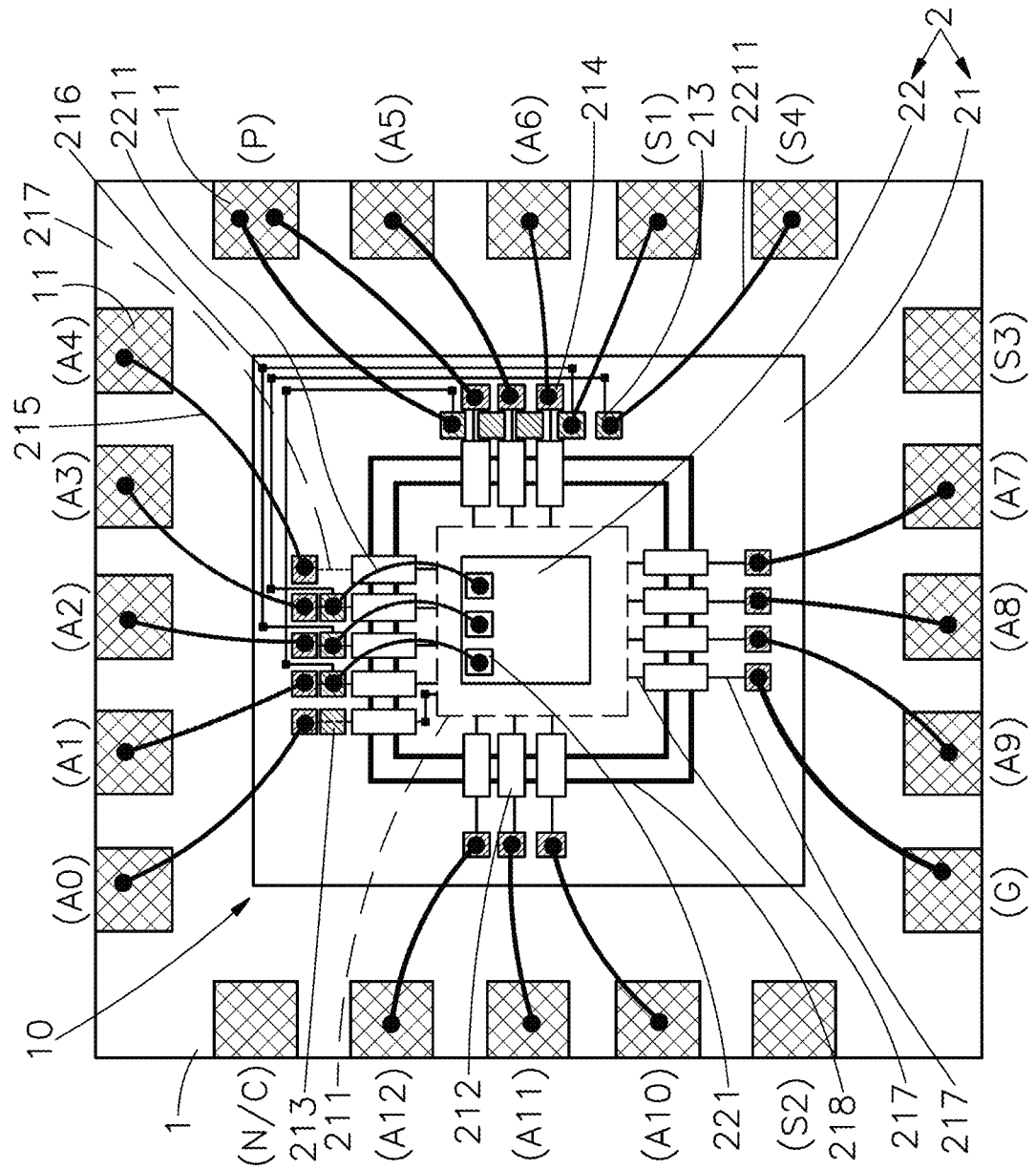
FIG. 2 is a top view of a chip of another embodiment of the present invention.
Figure 3:
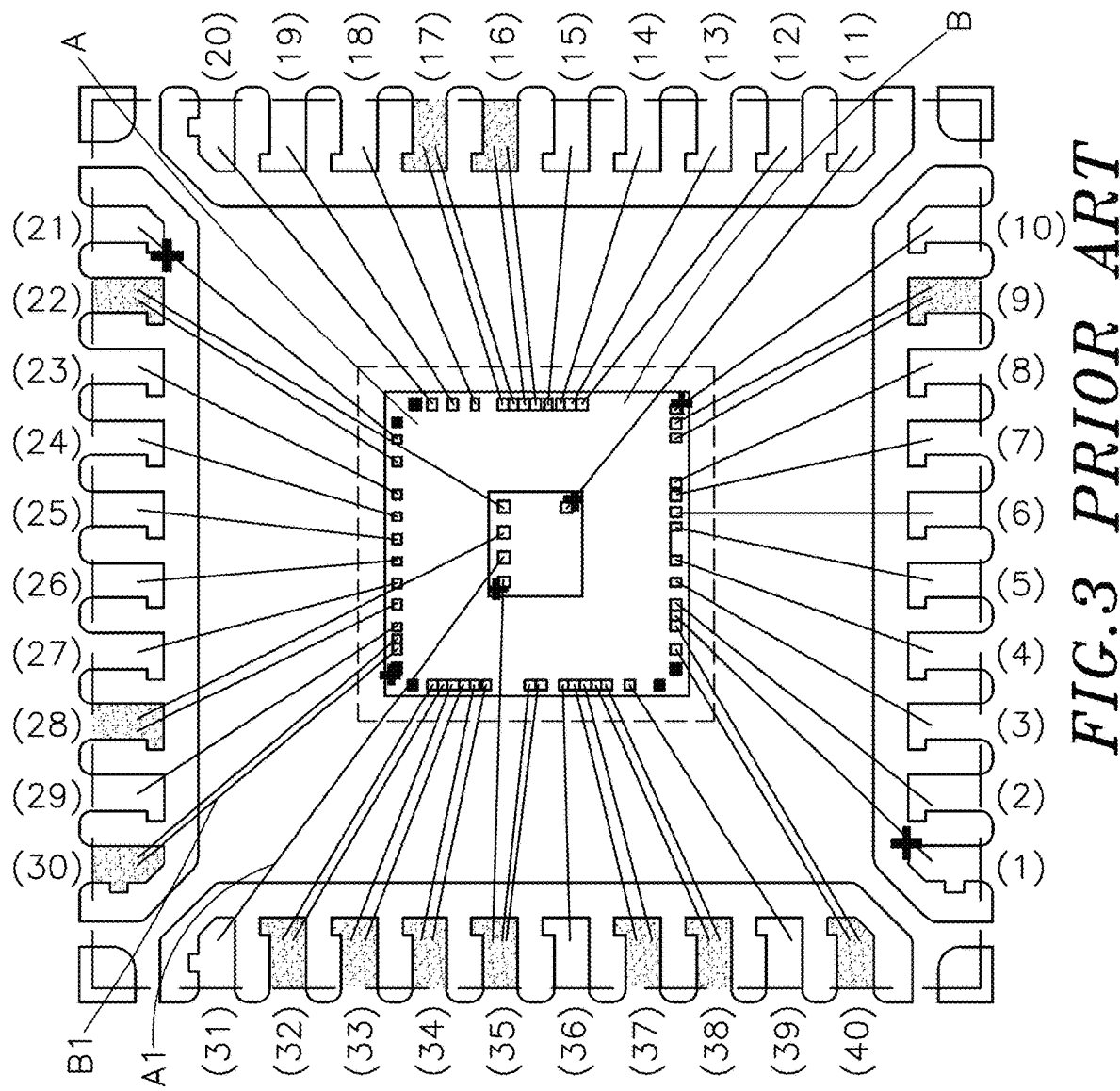
FIG. 3 is a top view of a conventional chip.
Figure 4:
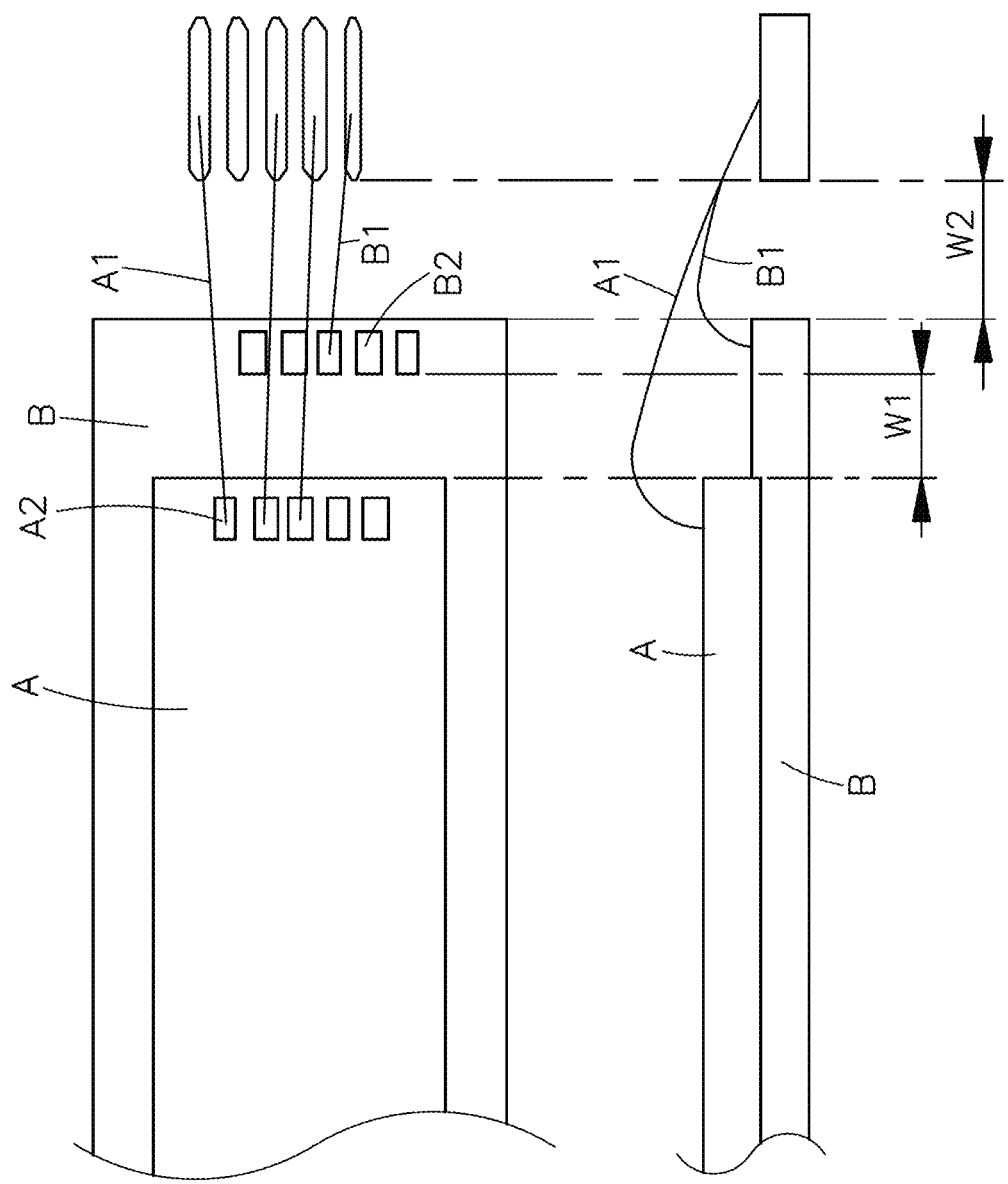
FIG. 4 is a side view of a part of a conventional chip.
Figure 5:
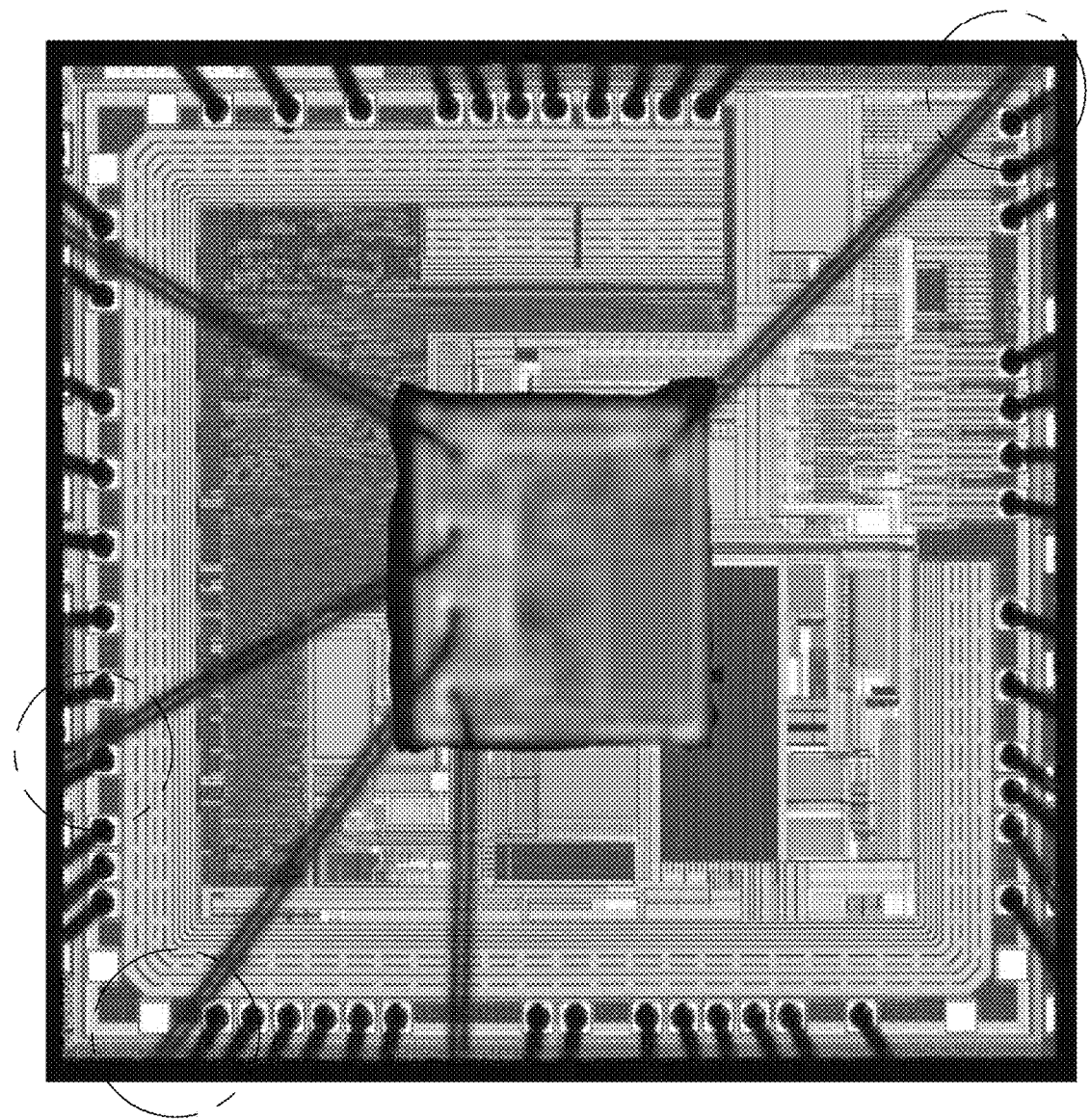
FIG. 5 is a first top view image of a conventional chip.
Figure 6:
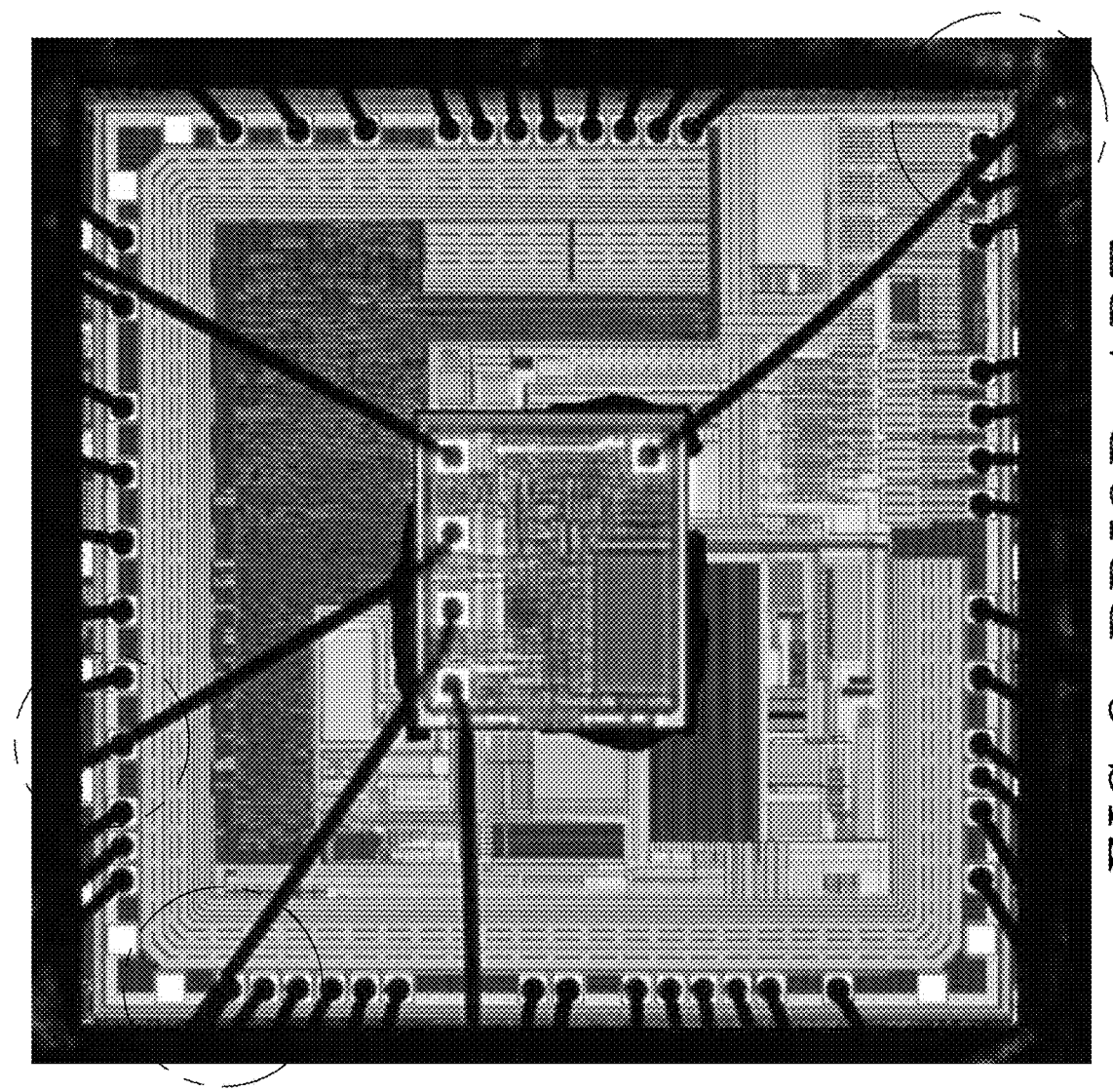
FIG. 6 is a second top view image of the conventional chip.

Please refer to FIGS. 1 and 2, which are a top view of a chip of a preferred embodiment of the present invention, and a top view of a chip of another embodiment of the present invention. As shown in FIGS. 1 and 2, in an embodiment of the multi-chip stacked package structure of the present invention, the package structure is a type of quad flat package (QFP); however, the practical implementation of the present invention is not limited to above-mentioned example. In an embodiment, the package structure includes a package carrier 1 and at least two chips 2.

The package carrier 1 includes a chip bonding area 10 defined on a central part thereof, a plurality of outer leads 11 disposed on at least one side thereof and configured to electrically connect to an external preset electronic circuit.

The at least two chips 2 includes a first chip 21 and a second chip 22; the first chip 21 includes a plurality of layers including, for example, a transistor layer, a plurality of metal layers and a plurality of VIA layers; the first chip 21 further includes a core 211 disposed on a surface thereof, and a plurality of input/output units 212 and a plurality of first bonding pads 213 disposed in an outward order from at least one side of the core 211; the first chip 21 further includes a plurality of dummy pads 214 disposed between the input/output units 212 and the adjacent first bonding pads 213 on at least one side of the core 211.

The second chip 22 is stacked and fixed on the top of the core 211 of the first chip 21, and the second chip 22 includes at least one group of second bonding pads 221 disposed on a surface thereof.

The plurality of first bonding pads 213 and the plurality of dummy pads 214, which are disposed on at least one side of the first chip 21, can be disposed on two opposite sides of the input/output units 212 in an alignment or misalignment manner, respectively; the plurality of first bonding pads 213 are electrically connected to the corresponding ones of the outer leads 11 on the package carrier 1 through first wires 215, respectively. The first chip 21 includes a plurality of layers including a transistor layer, a plurality of metal layers, and a plurality of VIA layers; the plurality of dummy pads 214 are disposed in the uppermost two metal layers, respectively, and each metal layer includes a routing line disposed in a direction of an X axis or a Y axis. Each VIA layer is disposed between two longitudinally-adjacent metal layers, and includes conductive via 216 configured to connect to the circuits of the two longitudinally-adjacent metal layers, so that the circuits of the two longitudinally-adjacent metal layers can be electrically conducted through the conductive via 216 of the VIA layer. Furthermore, the first chip 21 can include the plurality of dummy pads 214 disposed between the core 211, and the input/output units 212 disposed in the two different and adjacent arrangement directions, respectively; the first chip 21 includes an internal wire 217 disposed between the uppermost two or three metal layers and configured to electrically connect the adjacent dummy pads 214 arranged in the same direction or in two different and adjacent arrangement directions; in other words, each of the dummy pads 214 can be electrically connected to another dummy pad 214 through the internal wire 217 formed between the uppermost two or three metal layers and the VIA layer of the first chip 21, and the another dummy pad 214 is disposed in an appropriate position to connect to the corresponding outer lead 11 through the second wire 2211. By using the two dummy pads 214 electrically connected to the internal wire 217, the second wire 2211 can be prevented from being close or in contact with the first wire 215; therefore, when the design of the first bonding pads 213 of the first chip 21 or the design of the second bonding pads 221 of the second chip 22 is changed, the amount of the disposed dummy pads 214 can be increased or decreased to form the match between the first chip 21 and the second chip 22 without changing the design of the internal wire 217 in the layer of the first chip 21, thereby achieving purpose of time saving and labor-saving in design and manufacturing.

The first chip 21 includes at least one seal ring 218 disposed between the core 211 and the plurality of first bonding pads 213, and the plurality of input/output units 212 are disposed on the seal ring 218; at least one side of the core 211 can be electrically connected to the input/output units 212 and the first bonding pads 213 through the internal wire 217. It should be noted that the input/output unit 212 used for signal transmission (input or output) is well known in the art and is mostly used for impedance match or static electricity protect, and is an additional circuit but not a necessary circuit; however, when the input/output units 212 are added in the first chip, the circuit configuration of touch control IC is affected, so supplementary explanation is described herein; furthermore, the detail function of the input/output units 212 of the first chip 21 is not the key point of the present invention, so the detailed description is not repeated herein.

In an embodiment, the second chip 22 can be one of various types of chips, for example, the second chip 22 can be a memory chip (such as a volatile memory, a nonvolatile memory or a flash memory), an application processor chip, (such as a central processing unit), a graphics processing unit, a digital signal processor, a password processor, a microprocessor or a microcontroller.

When the aforementioned components are assembled and processed, the first chip 21 and the second chip 22, which are stacked with each other, are electrically fixed on the chip bonding area 10 of the package carrier 1, one of second bonding pads 221 on the surface of the second chip 22 can be electrically connected to corresponding one of the dummy pads 214 and corresponding one of the plurality of outer leads 11 of the package carrier 1 through the same second wire 2211; alternatively, one of the second bonding pads 221 on the surface of the second chip 22 can be electrically connected to the corresponding one of the plurality of dummy pads 214 through the second wire 2211, and another dummy pad 214 is electrically connected the corresponding one of the outer leads 11 of the package carrier 1 through another second wire 2211, so as to complete the wire bonding operation between the package carrier 1, the first chip 21 and second chip 22 of the chip 2. After the QFN package processing operation is completed, the package carrier 1, the first chip 21 and the second chip 22 can form the QFN type of automotive chip with the multi-chip package structure.

The plurality of first bonding pads 213 and the plurality of dummy pads 214 can be disposed on a side of the plurality of input/output units 212 of the first chip 21 in an alignment arrangement, a misaligned arrangement (such as a triangular arrangement), a straight-line arrangement, an oblique-line arrangement, an arc-curve arrangement; or the plurality of first bonding pads 213 and the plurality of dummy pads 214 can be arranged in two or multiple staggered rows; as long as one of the first bonding pads 213, one of the dummy pads 214, one of the second bonding pads 221 and one of the outer leads 11 are prevented from being close or in contact with the adjacent one of the first wires 215 and the adjacent one of second wires 2211. It should be noted that various equivalent structural changes, alternations or modifications based on the descriptions and figures of present invention are all consequently viewed as being embraced by the spirit and the scope of the present invention set forth in the claims.

According to the automotive chip of the present invention formed by QFN package, one of the second bonding pads 221 on the surface of the second chip 22 can be electrically connected to the corresponding one of the dummy pads 214 of the first chip 21 and the corresponding one of the outer leads 11 of the package carrier 1 through the same second wire 2211; in another embodiment, one of the second bonding pads 221 on the surface of the second chip 22 can be electrically connected to the corresponding one of the dummy pad 214 of the first chip 21, and the corresponding one of the dummy pad 214 can be electrically connected to the corresponding one of the outer leads 11 of the package carrier 1 through another second wire 2211, the plurality of first wires 215 and the plurality of second wires 2211 can be disposed in the same height, in an adjacent inside-and-outside arrangement, and in a separate configuration, so as to reduce the skew angle required in wire bonding to form electrical connection between the first bonding pads 213, the dummy pads 214, the bonding pads 221 and the outer leads 11, to effectively reduce curved parabola heights of the first wires 215 and the second wires 2211, thereby preventing each of the first wires 215 and each of the second wires 2211 from contacting the adjacent one of the first bonding pads 213, the adjacent one of the dummy pads 214, the adjacent one of the second bonding pads 221 or the adjacent one of the outer leads 11 because of excessive skew angles during wire bonding process; as a result, occurrence of voltage across generated on the first wire 215 and the second wire 2211, and the short circuit formed on the first bonding pad 213, the dummy pad 214 or the input/output unit 212 can be prevented. Furthermore, during the QFN package process, the adjacent first wire 215 and the second wire 2211 can be prevented from sinking, bending, shifting, being close to or in contact with each other because of packaging pressure and mold flow, and the first wire 215 and the second wire 2211 can also be prevented from short circuit caused by overlap or contact, so as to achieve purpose of easy to manufacture and improved product yield.

In the manufacturing process of automotive chip with multi-chip package, the first chip 21 and the second chip 22 are usually manufactured by different manufacturers, and the design of the first chip 21 must match with the pin design of the second bonding pads 221 of the second chip 22. In technical solution of the present solution, when the old second chip 22 must be replaced by the new second chip 22 of different manufacturer, it just needs to perform engineer change order (ECO) on the mask design pattern of the metal layer or VIA layer in the uppermost one to three layer of the first chip 21, to change the circuit layout configuration between the corresponding dummy pad 214 and the preset routing line; therefore, even if the pin design of the second bonding pad 221 of the second chip 22 is changed, it does not need to change the original design for layout and configuration of pattern of the first bonding pads 213, the input/output units 212, the core 211 in lower layers, or other metal layers of the first chip 21, so as to solve the wire bonding problem caused by the pin change of at least one group of second bonding pads 221 on the surface of the second chip 22 manufactured by different manufacturer, thereby effectively saving process time and reducing manufacturing costs to generate more economic benefits.

According to above-mentioned content, the present invention is mainly to provide design for the automotive chip with multi-chip package, and the key point of the present inventions is that the dummy pads 214 are disposed between the input/output units 212 and adjacent first bonding pads 213 on at least one side of the first chip 21, so as to reduce skew angles of the first wire 215 and the second wire 2211 during wire bonding process, so as to further prevent the first wire 215 and the second wire 2211 from contacting with each other to cause short circuit, and also prevent the first wires 215 and the second wires 2211 from contacting the input/output units 212, the first bonding pads 213 or the dummy pads 214 to cause short circuit during packaging process.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A multi-chip package structure, comprising:
a package carrier comprising a chip bonding area disposed on a central part thereof, and a plurality of outer leads disposed on at least one side thereof and configured to be electrically connected to an external preset electronic circuit; and
at least two chips comprising a first chip and a second chip, wherein the first chip is fixed on the chip bonding area of the package carrier and comprises an core disposed therein, and a plurality of input/output units and a plurality of first bonding pads disposed in an outward order from at least one side of the core and electrically connected to the core, and each of the plurality of first bonding pads is electrically connected to the corresponding one of the plurality of outer leads through a first wire, and the first chip further comprises a plurality of dummy pads disposed thereon, and each of the plurality of dummy pads is disposed between one of the plurality of input/output units and corresponding adjacent one of the plurality of first bonding pads on at least one side of the core;
wherein the second chip is stacked and fixed on a top of the core of the first chip, and comprises at least one group of second bonding pads electrically connected to the corresponding ones of the plurality of outer leads through a plurality of second wires and the plurality of dummy pads.

2. The multi-chip package structure according to claim 1, wherein the first chip comprises an core layer, a plurality of metal layers, and a plurality of VIA layers, and each of the metal layer comprises a routing line disposed in a direction of X axis or Y axis, and each of the plurality of VIA layers is disposed between the two longitudinally-adjacent of the plurality of metal layers and comprises a conductive via configured to connect the routing lines of the two longitudinally-adjacent of the plurality of metal layers, the core of the first chip is electrically connected to the plurality of input/output units and the plurality of first bonding pads, in a sequential order, through the preset routing lines of the plurality of metal layers.

3. The multi-chip package structure according to claim 2, wherein a plurality of dummy pads are disposed between the ones of the plurality of input/output units and the adjacent ones of the plurality of first bonding pads in two different and adjacent arrangement directions, respectively, and the uppermost two of the plurality of metal layers comprises routing lines configured to electrically connect the plurality of dummy pads disposed in two different and adjacent arrangement directions.

4. The multi-chip package structure according to claim 1, wherein the first chip comprises a seal ring disposed between the core and the plurality of first bonding pads, and the plurality of input/output units are disposed on the seal ring.

5. The multi-chip package structure according to claim 4, wherein the plurality of first bonding pads and a plurality of dummy pads disposed on two relative outer sides of one of the plurality of input/output units on at least one side of the first chip are in an alignment arrangement.

6. The multi-chip package structure according to claim 4, wherein the plurality of first bonding pads and a plurality of dummy pads disposed on two relative outer sides of one of the plurality of input/output units on at least one side of the first chip are in a misalignment arrangement.

7. The multi-chip package structure according to claim 1, wherein each of the second bonding pads in the at least one group of second bonding pads of the second chip is electrically connected to the corresponding one of the plurality of dummy pad and the corresponding one of the plurality of outer leads through the same one of the plurality of second wires.

8. The multi-chip package structure according to claim 1, wherein each of the plurality of second bonding pads in the at least one group of second bonding pads of the second chip is electrically connected to corresponding one of the plurality of dummy pads on the surface of the first chip through one of the plurality of second wires, and the corresponding one of the plurality of dummy pads is electrically connected to another one of the plurality of dummy pads through an internal wire of the first chip, and the another one of the plurality of dummy pads is electrically connected to the corresponding one of the plurality of outer leads through another one of the plurality of second wires.

9. The multi-chip package structure according to claim 1, wherein the second chip is a memory chip, an application processor chip, or a graphics processing unit.

* * * * *